(12) United States Patent
Ishii et al.

(10) Patent No.: US 8,134,080 B2
(45) Date of Patent: Mar. 13, 2012

(54) WIRED CIRCUIT BOARD

(75) Inventors: Jun Ishii, Osaka (JP); Yasuhito Ohwaki, Osaka (JP); Yasuhito Funada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 597 days.

(21) Appl. No.: 11/477,935

(22) Filed: Jun. 30, 2006

(65) Prior Publication Data

US 2007/0017695 A1   Jan. 25, 2007

(30) Foreign Application Priority Data

Jul. 7, 2005   (JP) ................... 2005-199035

(51) Int. Cl.
*H05K 1/09* (2006.01)
(52) U.S. Cl. ......... 174/255; 174/256; 174/257; 257/758
(58) Field of Classification Search .............. 257/758; 174/255, 256, 257
See application file for complete search history.

(56) References Cited

U.S. PATENT DOCUMENTS

| | | |
|---|---|---|
| 5,608,591 A | 3/1997 | Klaassen |
| 5,612,512 A | 3/1997 | Wakamatsu et al. |
| 5,666,717 A | 9/1997 | Matsumoto et al. |
| 5,709,957 A | 1/1998 | Chiang et al. |
| 5,796,552 A | 8/1998 | Akin, Jr. et al. |
| 5,812,344 A | 9/1998 | Balakrishnan |
| 5,857,257 A | 1/1999 | Inaba |
| 5,862,010 A | 1/1999 | Simmons et al. |
| 5,995,329 A | 11/1999 | Shiraishi et al. |
| 6,100,582 A | 8/2000 | Omote et al. |
| 6,147,876 A | 11/2000 | Yamaguchi et al. |
| 6,162,996 A | 12/2000 | Schmidt et al. |
| 6,242,103 B1 | 6/2001 | Farnworth et al. |
| 6,399,899 B1 | 6/2002 | Ohkawa et al. |
| 6,480,359 B1 | 11/2002 | Dunn et al. |
| 6,602,584 B2 * | 8/2003 | Jo et al. ............... 428/209 |
| 6,735,052 B2 | 5/2004 | Dunn et al. |
| 7,013,561 B2 | 3/2006 | Nakatani et al. |
| 7,067,912 B2 | 6/2006 | Takeuchi et al. |
| 7,182,606 B2 | 2/2007 | Ishii et al. |
| 7,319,573 B2 | 1/2008 | Nishiyama |
| 2002/0007961 A1* | 1/2002 | Yamato et al. ........ 174/250 |
| 2002/0074662 A1 | 6/2002 | Hong et al. |
| 2002/0100609 A1* | 8/2002 | Ookawa et al. ........ 174/255 |
| 2003/0045024 A1 | 3/2003 | Shimoto et al. |
| 2004/0065717 A1* | 4/2004 | Saijo et al. ............ 228/115 |

(Continued)

FOREIGN PATENT DOCUMENTS

CN   1112877   12/1995

(Continued)

*Primary Examiner* — Junghwa M Im
(74) *Attorney, Agent, or Firm* — Jean C. Edwards, Esq.; Edwards Neils PLLC (57) ABSTRACT

A wired circuit board that can provide an enhanced adhesion of a metal supporting board at a marginal portion of an opening formed in the metal supporting board with a simple structure to prevent stripping of the metal supporting board. In a suspension board with circuit, in order to reduce a transmission loss of a conductive pattern, a metal foil embedded in an insulating base layer is formed in a pattern comprising a first metal foil portion and a second metal foil portion surrounding the first metal foil portion spaced apart therefrom, and an opening is formed in the metal supporting board so that a marginal portion of the opening is located in a space between the first metal foil portion and the second metal foil portion.

5 Claims, 5 Drawing Sheets

U.S. PATENT DOCUMENTS

| | | |
|---|---|---|
| 2004/0173375 A1 | 9/2004 | Lee et al. |
| 2004/0245015 A1 | 12/2004 | Yoshimi et al. |
| 2004/0245619 A1 | 12/2004 | Takeuchi et al. |
| 2004/0246626 A1 | 12/2004 | Wakaki et al. |
| 2004/0252413 A1 | 12/2004 | Nishiyama |
| 2005/0061542 A1 | 3/2005 | Aonuma et al. |
| 2005/0122627 A1 | 6/2005 | Kanagawa et al. |
| 2005/0186332 A1 | 8/2005 | Funada et al. |
| 2005/0248885 A1 | 11/2005 | Funada et al. |
| 2005/0254175 A1 | 11/2005 | Swanson et al. |
| 2006/0199402 A1 | 9/2006 | Ishii et al. |
| 2007/0017695 A1 | 1/2007 | Ishii et al. |
| 2007/0041123 A1 | 2/2007 | Swanson et al. |

FOREIGN PATENT DOCUMENTS

| | | |
|---|---|---|
| CN | 1339822 | 3/2002 |
| CN | 1415474 | 5/2003 |
| CN | 1469805 A | 1/2004 |
| EP | 1592290 | 11/2005 |
| JP | 59-219492 | 12/1984 |
| JP | 1-150390 | 6/1989 |
| JP | 3-274799 | 12/1991 |
| JP | 05-304345 | 11/1993 |
| JP | 07-202365 | 8/1995 |
| JP | 08-241894 | 9/1996 |
| JP | 8-307020 | 11/1996 |
| JP | 9-282624 | 10/1997 |
| JP | 10-163590 | 6/1998 |
| JP | 10-507028 | 7/1998 |
| JP | 2000-513861 | 10/2000 |
| JP | 2001-085842 | 3/2001 |
| JP | 2001-202731 | 7/2001 |
| JP | 2001-256627 | 9/2001 |
| JP | 2002-057437 | 2/2002 |
| JP | 2002-111205 | 4/2002 |
| JP | 2002-124767 | 4/2002 |
| JP | 2002-198462 | 7/2002 |
| JP | 2002-222578 | 8/2002 |
| JP | 2003-151114 | 5/2003 |
| JP | 2003-152404 | 5/2003 |
| JP | 2003-197459 | 7/2003 |
| JP | 2004-14975 | 1/2004 |
| JP | 2004-501511 | 1/2004 |
| JP | 2004-088020 | 3/2004 |
| JP | 2004-111578 | 4/2004 |
| JP | 2004-186342 | 7/2004 |
| JP | 2004-363205 | 12/2004 |
| JP | 2004-363331 | 12/2004 |
| JP | 2005-11387 | 1/2005 |
| JP | 2005-100488 | 4/2005 |
| JP | 2005-158973 | 6/2005 |
| JP | 2005-235318 | 9/2005 |
| JP | 2005-322336 | 11/2005 |
| JP | 2006-173399 | 6/2006 |
| JP | 2006-245220 | 9/2006 |
| JP | 2007-019261 | 1/2007 |
| JP | 2007-088056 | 4/2007 |

\* cited by examiner

WIRED CIRCUIT BOARD

CROSS REFERENCE TO RELATED APPLICATION

This application claims a priority from Japanese Patent Appln. No. 2005-199035, filed Jul. 7, 2005, the contents of which are herein incorporated by reference in their entirety.

BACKGROUND OF THE INVENTION

1. Field of the Invention

The present invention relates to a wired circuit board and, more particularly, to a wired circuit board adapted to higher density and higher speed.

2. Description of the Prior Art

A suspension board with circuit mounted on a hard disc drive commonly comprises a metal supporting board, an insulating base layer formed on the metal supporting board, a conductive pattern formed on the insulating base layer, and an insulating cover layer formed on the insulating base layer for covering the conductive pattern. As is known, this suspension board with circuit is configured so that the metal supporting board has an opening formed to correspond to the conductive pattern so as to adjust a characteristic impedance of the conductive pattern and improve a partial flexibility.

It has been proposed in recent years that the suspension board with circuit adapted to higher density and higher speed is designed to have a lower conductor provided under the conductive pattern via the insulating layer in order to reduce a transmission loss of the conductive pattern (Cf. Japanese Unexamined Patent Publication No. 2005-11387, for example).

Figure 8:
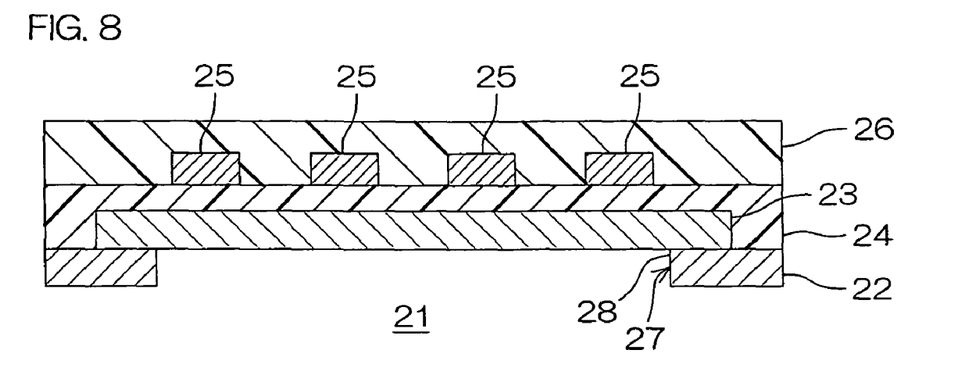
FIG. 8 is a sectional view of a principal part showing a conventional type of a suspension board with circuit.

However, when the known suspension board with circuit having the opening formed in the metal supporting board is provided with such a lower conductor as described in Japanese Unexamined Patent Publication No. 2005-11387 cited above, there may be provided an arrangement as shown in FIG. 8 wherein an edge 28 of the opening 27 formed in the metal supporting board 22 overlaps with a surface of the lower conductor 23 provided under the conductive pattern 25 covered by the insulating cover layer 26 via the insulating base layer 24. In this arrangement in which the edge 28 of the opening 27 overlaps with the surface of the lower conductor 23, adhesion between the metal supporting board 22 and the lower conductor 23 is low at the overlapping portion thereof. Due to this, there is a possible problem that when the suspension board with circuit 21 is bent, the metal supporting board 22 may be stripped from the metal foil 23 at the edge 28 of the opening 27.

SUMMARY OF THE INVENTION

It is an object of the present invention to provide a wired circuit board that can provide an enhanced adhesion of a metal supporting board at a marginal portion of an opening formed in the metal supporting board with a simple structure to prevent stripping of the metal supporting board.

The present invention provides a novel wired circuit board comprising a metal supporting board, an insulating layer formed on the metal supporting board, a conductive pattern formed on the insulating layer, and a metal foil embedded in the insulating layer, wherein an opening confronting at least a part of the conductive pattern is formed in the metal supporting board, and wherein at least a part of the metal foil is placed in the opening and exposed from the insulating layer not to overlap with a marginal portion of the opening, and at least a part of the marginal portion of the opening of the metal supporting board is put in direct contact with the insulating layer.

According to the wired circuit board of the present invention, at least a part of the metal foil is placed in the opening and exposed from the insulating layer not to overlap with the marginal portion of the opening, and at least a part of the marginal portion of the opening of the metal supporting board is put in direct contact with the insulating layer. This construction can provide an enhanced adhesion of the marginal portion of the opening of the metal supporting board. This can produce the result of preventing the stripping of the metal supporting board effectively, while adjusting a characteristic impedance of the conductive pattern and reducing a transmission loss of the same, with a simple structure.

In the wired circuit board of the present invention, it is preferable that the metal foil comprises a first metal foil portion placed in the opening, and a second metal foil portion which is spaced apart from the first metal foil portion so that a contact portion of the marginal portion of the opening of the metal supporting board with the insulating layer is located between the first metal foil portion and the second metal foil portion and which confronts the metal supporting board.

According to the wired circuit board of the present invention, the metal foil comprises the first metal foil portion placed in the opening, and the second metal foil portion which is spaced apart from the first metal foil portion so that the contact portion of the marginal portion of the opening of the metal supporting board with the insulating layer is located between the first metal foil portion and the second metal foil portion and which confronts the metal supporting board. This construction can provide a result of ensuring a sufficient placement area of the metal foil, while providing an enhanced adhesion of the marginal portion of the opening of the metal supporting board. This can provide the advantage of providing a further reduction of the transmission loss of the conductive pattern, with a simple structure.

In the wired circuit board of the present invention, it is preferable that a thin metal film is interposed between the metal supporting board and the second metal foil portion.

This construction of the wired circuit board of the present invention can provide the advantage of providing enhanced adhesion between the metal supporting board and the second metal foil portion with a simple structure. This can prevent the stripping of the metal supporting board further effectively.

In the wired circuit board of the present invention, it is preferable that the metal supporting board is formed of stainless steel, the metal foil is formed of copper or a copper alloy, and the insulating layer is formed of polyimide.

It is preferable that the wired circuit board of the present invention is a suspension board with circuit.

BRIEF DESCRIPTION OF THE DRAWINGS

In the drawings:

FIG. 3 is a production process drawing showing a production method of the suspension board with circuit shown in FIG. 1, (a) showing the process of forming a thin metal film on a metal supporting board, (b) showing the process of forming a plating resist of a reverse pattern to a pattern of the metal foil, (c) showing the process of forming a metal foil on a surface of the thin metal film exposed from the plating resist, (d) showing the process of removing the plating resist and the thin metal film on which the plating resist is formed, (e) showing the process of forming a thin protection film on a surface of the metal foil and thin metal film, (f) showing the process of forming an insulating base layer on the metal supporting board to cover the metal foil, the thin metal film, and the thin protection film, (g) showing the process of forming a conductive pattern on the insulating base layer, (h) showing the process of forming an insulating cover layer on the insulating base layer to cover the conductive pattern, and (i) showing the process of forming an opening in the metal supporting board.

DETAILED DESCRIPTION OF THE PREFERRED EMBODIMENTS

Figure 1:
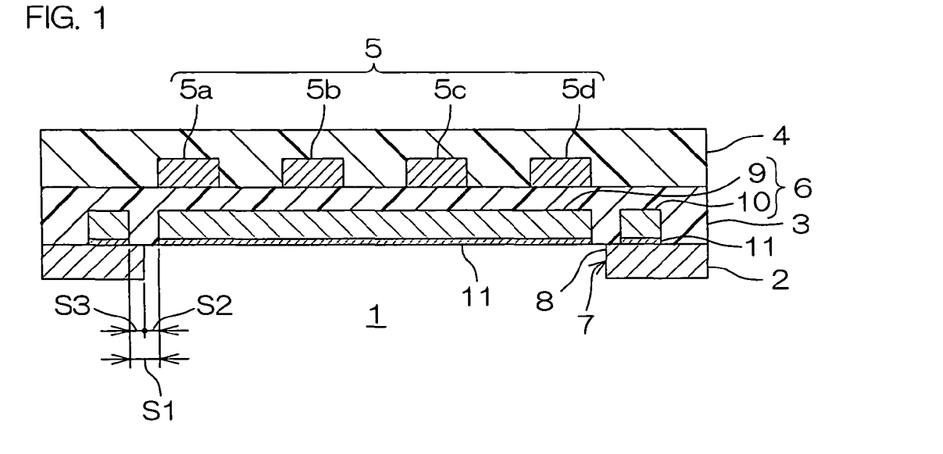
FIG. 1 is a sectional view of a principal part showing a suspension board with circuit of an embodiment of a wired circuit board of present invention.
Figure 2:
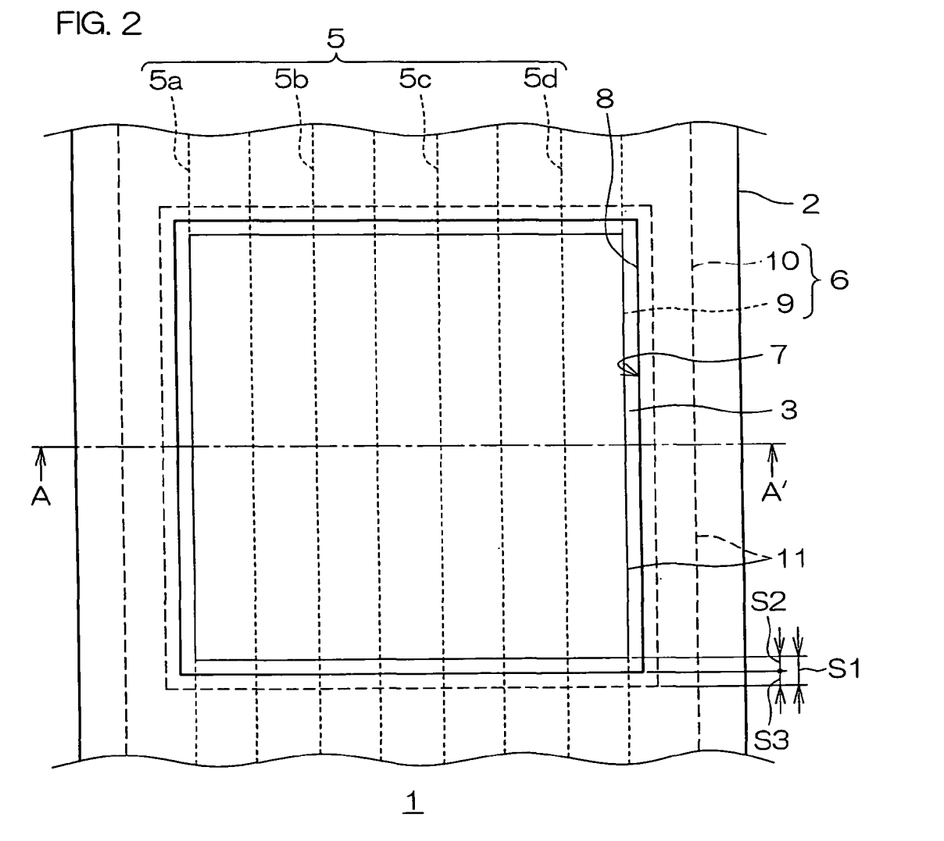
FIG. 2 is a bottom view of a principal part of the suspension board with circuit shown in FIG. 1.
Figure 3:
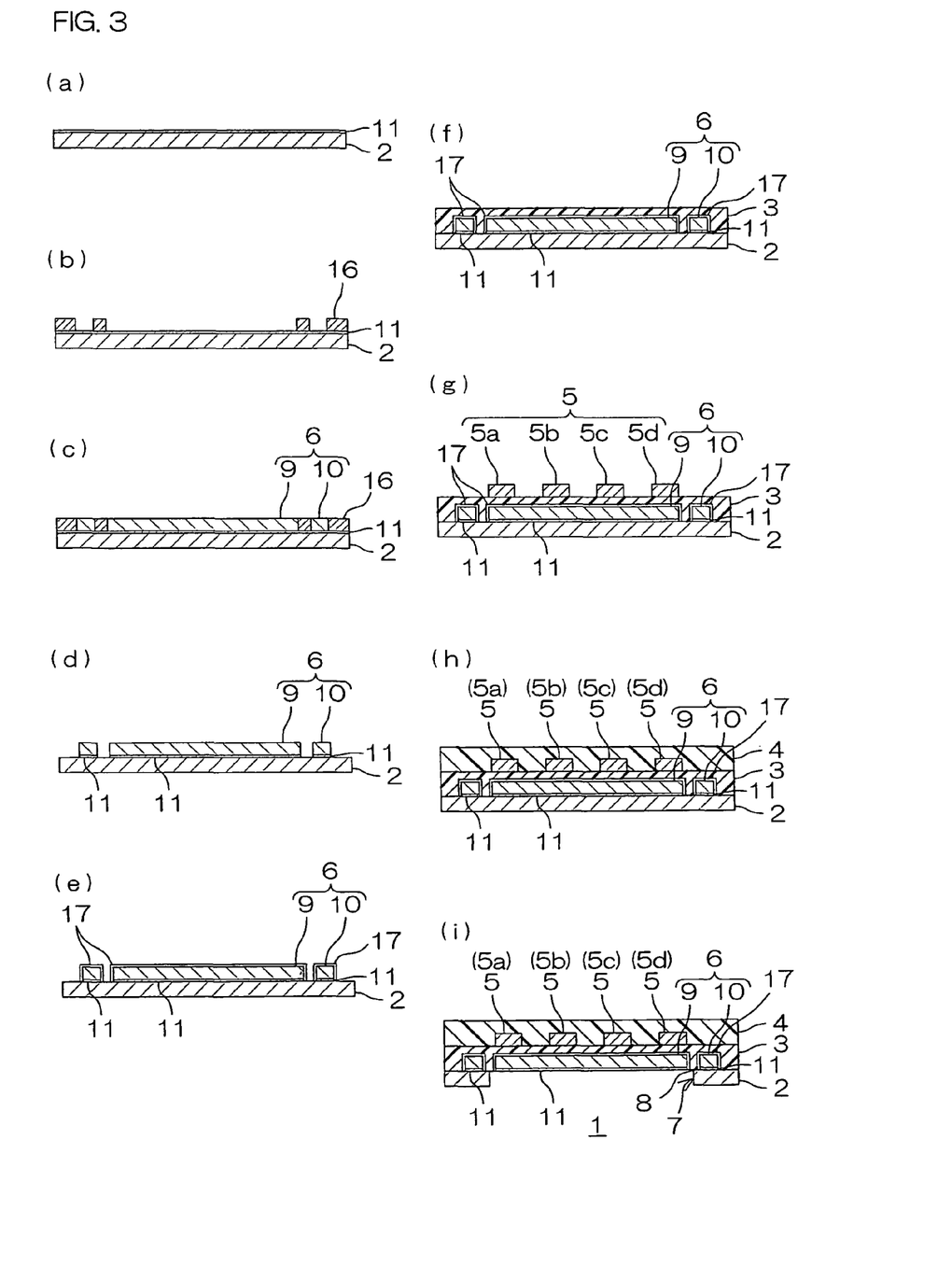

FIG. 1 is a sectional view of a principal part of a suspension board with circuit, showing an embodiment of a wired circuit board of the present invention. FIG. 2 is a bottom view of the same. FIG. 1 corresponds to a sectional view taken along line A-A' of FIG. 2. In FIGS. 1 and 2, a thin protection film 17 (Cf. FIG. 3(i)) as will be mentioned later is omitted.

As shown in FIG. 1, the suspension board with circuit 1 is a suspension board with circuit to be mounted on a hard disc drive, comprising a metal supporting board 2, an insulating base layer 3 formed as an insulating layer on the metal supporting board 2, a conductive pattern 5 formed on the insulating base layer 3, and a metal foil 6 embedded in the insulating base layer 3. In this suspension board with circuit 1, an insulating cover layer 4 is formed on the insulating base layer 3 to cover the conductive pattern 5.

As shown in FIG. 2, the metal supporting board 2 is formed of a metal foil or a thin metal plate of a flat-plate form extending in a longitudinal direction (in a vertical direction as viewed in FIG. 2, which is hereinafter referred to as "the lengthwise direction"). The metals that may be used for forming the metal supporting board 2 include, for example, stainless steel and 42-alloy. Preferably, stainless steel is used for the metal supporting board 2. The metal supporting board 2 has a thickness of e.g. 15-30 µm, or preferably 20-25 µm.

The insulating base layer 3 embeds the metal foil 6 and is formed on the metal supporting board 2, as shown in FIG. 1. Insulating materials that may be used for forming the insulating base layer 3 include, for example, synthetic resins commonly used for the insulating materials of the wired circuit board, such as, polyimide, polyether nitrile, polyether sulfone, polyethylene terephthalate, polyethylene naphthalate, and polyvinyl chloride. Of these synthetic resins, polyimide, or preferably photosensitive polyimide, is preferably used for the insulating base layer 3. The insulating base layer 3 has a thickness of e.g. 5-15 µm, or preferably 8-10 µm.

The conductive pattern 5 is formed on a surface of the insulating base layer 3 to be in the form of a wired circuit pattern configured by a plurality of wires spaced apart from each other and arranged in parallel along the lengthwise direction (two lines of wire 5a and 5d arranged at the outermost ends in the widthwise direction (orthogonal to the lengthwise direction) and two lines of wire 5b and 5c located at the inside of the two lines of wire 5a and 5d), as shown in FIGS. 1 and 2. Conductors that may be used for forming the conductive pattern 5 include, for example, metals commonly used for the conductor of the wired circuit board, such as, copper, nickel, gold, solder, or alloys thereof. Of these metals, copper is preferably used for the conductive pattern 5. The conductive pattern 5 has a thickness of e.g. 5-20 µm, or preferably 7-15 µm. A width of each wire (a widthwise length) is in a range of e.g. 10-100 µm, or preferably 15-501 µm, and a space between adjacent lines of the wires is in a range of e.g. 10-100 µm, or preferably 15-50 µm.

The metal foil 6 is embedded in the insulating base layer 3 so as to face a lower surface (a contact surface of the same with the metal supporting board 2) of the insulating base layer 3 via a thin metal film 11 mentioned later, as shown in FIG. 1. The metals that may be used for forming the metal foil 6 include, for example, chromium, copper, gold, silver, platinum, nickel, titanium, silicon, manganese, zirconium, and alloys thereof or oxides thereof. Of these metals, copper or a copper alloy is preferably used for forming the metal foil 6. The metal foil 6 has a thickness of e.g. 2-5 µm, or preferably 2-4 µm.

The metal foil 6 is formed in a pattern comprising a first metal foil portion 9 and a second metal foil portion 10.

The first metal foil portion 9 is formed inside the second metal foil portion 10 with a space S1 therefrom, as shown in FIG. 2. This first metal foil portion 9 is arranged opposite to a middle portion in the lengthwise direction of the conductive pattern 5 and shaped in a rectangular form slightly smaller than an opening 7 mentioned later, when viewed from bottom.

The first metal foil portion 9 is formed to have a width (a widthwise length) corresponding to a length extending between the outside edges of the wires 5a and 5d, which is formed to have a desired length (a desired lengthwise dimension).

To be more specific, the first metal foil portion 9 has a width of e.g. 0.05-10 mm, or preferably 0.1-2 mm, and a length of e.g. 0.05-10 mm, or preferably 0.1-2 mm.

The second metal foil portion 10 surrounds the first metal foil portion 9 with the space S1 therefrom and is arranged opposite to a middle portion in the lengthwise direction of the conductive pattern 5.

The second metal foil portion 10 is formed to have a width larger than the length extending between the outside edges of the wires 5a and 5d and smaller than a width of the metal supporting board 2, which is formed to have a desired length larger than the length of the first metal foil portion 9.

The space S1 defined between the first metal foil portion 9 and the second metal foil portion 10 is shaped into a rectangular frame form, when viewed from bottom. A width of the space S1 along the widthwise direction is e.g. 20-100 µm, or preferably 30-50 µm, and a width of the space S1 extending along the lengthwise direction is e.g. 20-100 µm, or preferably 30-50 µm.

A thin metal film 11 is formed on a lower surface of the metal foil 6, as shown in FIG. 1.

The thin metal film 11 on the lower surface of the second metal foil portion 10 is formed to be interposed between the lower surface of the second metal foil portion 10 and the metal supporting board 2, and the thin metal film 11 on the lower surface of the first metal foil portion 9 is formed to be exposed from the opening 7 mentioned later. For example, the same metal as the metal used for the metal foil 6 may be used for forming the thin metal film 11. Preferably, copper and chromium can be used for the thin metal film 11. The thin metal film 11 has a thickness of e.g. 0.01-1 μm, or preferably 0.1-1 μm.

In consideration of an adhesion between the metal suspension board 2 and the second metal foil portion 10, the thin metal film 11 on the lower surface of the second metal foil portion 10 in particular may be in the form of a multilayer film by laminating, for example, a first thin metal film 11 formed of a metal having a high adhesion strength to the metal suspension board 2 to contact with the surface of the metal suspension board 2, and a second thin metal layer 11 formed of a metal having a high adhesion strength to the second metal foil portion 10 to contact with the surface of the thin metal film 10.

The insulating cover layer 4 is formed on a surface of the insulating cover layer 3 to cover the conductive pattern 5. The same insulating materials as those used for forming the insulating base layer 3 may be used for forming the insulating cover layer 4. The insulating cover layer 4 has a thickness of e.g. 3-10 μm, or preferably 4-5 μm.

In this suspension board with circuit 1, the opening 7 is formed in the metal supporting board 2.

As shown in FIG. 2, the opening 7 is arranged opposite to a middle portion in the lengthwise direction of the conductive pattern 5 and is shaped into a rectangular form slightly larger than the first metal foil portion 9, when viewed from the bottom, so that a marginal portion 8 of the opening 7 can be located in the space S1 defined between the first metal foil portion 9 and the second metal foil portion 10. As a result, the marginal portion 8 of the opening 7 in the metal supporting board 2 is put in direct contact with the lower surface of the insulating base layer 3, as shown in FIG. 1. In addition, the first metal foil portion 9 is located within the opening 7 and is exposed from the insulating base layer 3 not to overlap with the marginal portion 8 of the opening 7. Further, the second metal foil portion 10 is spaced with the space S1 from the first metal foil portion 9 so that a contact portion of the marginal portion 8 of the opening 7 with the insulating base layer 3 is located between the first metal foil portion 9 and the second metal foil portion 10, which confronts the metal supporting board 2.

A space S2 of the space S1 extending between the marginal portion 8 of the opening 7 and the marginal portion of the first metal foil portion 9 has a widthwise dimension of e.g. 10-50 μm, or preferably 15-30 μm, and a lengthwise dimension of e.g. 10-50 μm, or preferably 15-30 μm. A space S3 of the space S1 extending between the marginal portion 8 of the opening 7 and the marginal portion of the second metal foil portion 10 has a widthwise dimension of e.g. 10-50 μm, or preferably 15-30 μm, and a lengthwise dimension of e.g. 10-50 μm, or preferably 15-30 μm.

This suspension board with circuit 1 can be produced by the method shown in FIG. 3, for example.

First, the metal supporting board 2 is prepared and, then, the thin metal film 11 is formed on the entire surface of the metal supporting board 2 by sputtering or by electrolytic plating, as shown in FIG. 3(a).

Then, a plating resist 16 is formed to have a reverse pattern to a pattern of the metal foil 6, as shown in FIG. 3(b). The plating resist 16 is formed by a known method using e.g. a photosensitive dry film resist for exposure to light and development.

Then, the metal foil 6 is formed on the surface of the thin metal film 11 exposed from the plating resist 16 by electrolytic plating, or preferably by electrolytic copper plating, to be in the form of a pattern in which the first metal foil portion 9 and the second metal foil portion 10 are formed, as shown in FIG. 3(c).

Then, the plating resist 16 and the thin metal film 11 in an area where the plating resist 16 is formed are removed by a known etching process, such as a chemical etching (wet etching), or by stripping, as shown in FIG. 3(d).

Then, a thin protection film 17 is formed on surfaces of the metal foil 6 and on surfaces of the thin metal film 11 (respective surfaces of upper and lateral side surfaces of the metal foil 6, and lateral side surfaces of the thin metal film 11), as shown in FIG. 3(e). The thin protection film 17 is formed using a known method, such as, for example, sputtering and plating. Preferably, the thin protection film is formed by electroless plating. The metals that may be used for forming the thin protection film 17 include, for example, gold, silver, platinum, nickel, titanium, silicon, manganese, zirconium, and alloys thereof or oxides thereof. Of these metals, nickel or a nickel alloy is preferably used for forming the thin protection film 17. The thin protection film 17 has a thickness of e.g. 0.05-0.2 μm. This thin protection film 17 provides an enhanced adhesion between the metal foil 6 and thin metal film 11 and the insulating base layer 3, and prevents a diffusion of the metal of the metal foil 6 and the thin metal film 11 into the insulating base layer 3.

When the thin protection film 17 is formed by the electroless plating, the surface of the metal supporting board 2 is passivated. As a result, the thin protection film 17 is not formed on the surface of the metal supporting board 2 exposed from the metal foil 6, but is formed selectively on the surfaces of the metal foil 6 and the surfaces of the thin metal film 11 (respective surfaces of the upper and lateral side surfaces of the metal foil 6 and the lateral side surfaces of the thin metal film 11).

Next, for example, a solution (varnish) of the synthetic resin cited above is uniformly coated over the surfaces of the metal supporting board 2 to cover the metal foil 6, the thin metal film 11, and the thin protection film 17, and then dried, as shown in FIG. 3(f), then and cured by heat, if necessary. The insulating base layer 3 is formed in the manner mentioned above. Alternatively, the insulating base layer 3 may be formed to be in the form of a pattern by exposing the photosensitive synthetic resin to light and developing it. Further, the method for forming the insulating base layer 3 is not limited to the method mentioned above. The insulating base layer 3 may be formed, for example, by a method that after a synthetic resin is previously formed in a film form, the resulting film is adhesively bonded to the surfaces of the metal supporting board 2 to cover the metal foil 6, the thin metal film 11, and the thin protection film 17 via a known adhesive layer.

Then, the conductive pattern 5 is formed in the wired circuit pattern mentioned above by a known patterning process such as an additive process or a subtractive process, as shown in FIG. 3(g).

For example, when the conductive pattern 5 is formed by the additive process, a thin conductive film serving as a ground layer is formed on the entire surface of the insulating base layer 3 by a vacuum film forming method or sputtering, for example, first. Then, after a dry film resist is formed on a surface of the thin conductive film, the dry film resist thus formed is exposed to light and then developed to form a plating resist having a reverse pattern to a pattern of the conductive pattern 5. Then, the conductive pattern 5 is formed by plating on the surface of the thin conductive film exposed from the plating resist. Then, the plating resist and the thin conductive film in the area where the plating resist is formed are removed by etching or by stripping. Although either the electrolytic plating or the electroless plating may be used for forming the conductive pattern 5, the electrolytic plating is preferably used. Particularly, the electrolytic copper plating is preferably used.

On the other hand, when the conductive pattern 5 is formed by the subtractive process, a conductor layer is formed over the entire surface of the insulating base layer 3, first. No particular limitation is imposed on the formation of such a conductor layer. For example, the conductor layer may be adhesively bonded to the entire surface of the insulating base layer 3 via a known adhesive layer, first. Then, after a dry film resist is formed on the conductor layer, the dry film resist is subjected to exposure to light and development to form an etching resist having the same pattern as the conductive pattern 5 on the surface of the conductor layer. Then, after the conductor layer exposed from the etching resist is removed by a chemical etching (wet etching), the etching resist is removed.

Then, for example, a solution (varnish) of the synthetic resin cited above is uniformly coated over the surfaces of the insulating base layer 3 to cover the conductive pattern 5 and then dried, as shown in FIG. 3(*h*), and then cured by heat, if necessary. Alternatively, the insulating cover layer 4 may be formed to be in the form of a pattern by exposing the photosensitive synthetic resin to light and developing it. Further, the method for forming the insulating cover layer 4 is not limited to the method mentioned above. The insulating cover layer 4 may be formed, for example, by a method that after a synthetic resin is previously formed in film form, the resulting film is adhesively bonded to the surfaces of the insulating base layer 3 to cover the conductive pattern 5 via a known adhesive layer.

Then, the opening 7 is formed in the metals supporting board 2 by the known method such as etching, as shown in FIG. 3(*i*).

In the suspension board with circuit 1 thus produced, the first metal foil portion 9 is placed within the opening 7 and exposed from the insulating base layer 3 not to overlap with the marginal portion 8 of the opening 7, and the marginal portion 8 of the opening 7 of the metal supporting board 2 is put in direct contact with the insulating base layer 3, as shown in FIGS. 1 and 2. This construction can provide an enhanced adhesion of the metal supporting board at the marginal portion 8 of the opening 7. This can produce the result of preventing stripping of the metal supporting board 2 effectively, while adjusting a characteristic impedance of the conductive pattern 5 and reducing a transmission loss of the same with a simple structure.

Also, in this suspension board with circuit 1, the metal foil 6 comprises the first metal foil portion 9 placed within the opening 7, and the second metal foil portion 10 confronting to the metal supporting board 2. This construction can provide the result of ensuring a sufficient placement area of the metal foil 6, while providing an enhanced adhesion of the marginal portion 8 of the opening 7 of the metal supporting board 2. This can provide the advantage of providing a further reduction of the transmission loss of the conductive pattern 5 with a simple structure.

In this suspension board with circuit 1, the thin metal film 11 is interposed between the metal supporting board 2 and the second metal foil portion 10. This construction can provide the advantage of providing an enhanced adhesion between the metal supporting board 2 and the second metal foil portion 10 with a simple structure. This can prevent stripping of the metal supporting board 2 further effectively.

Figure 4:
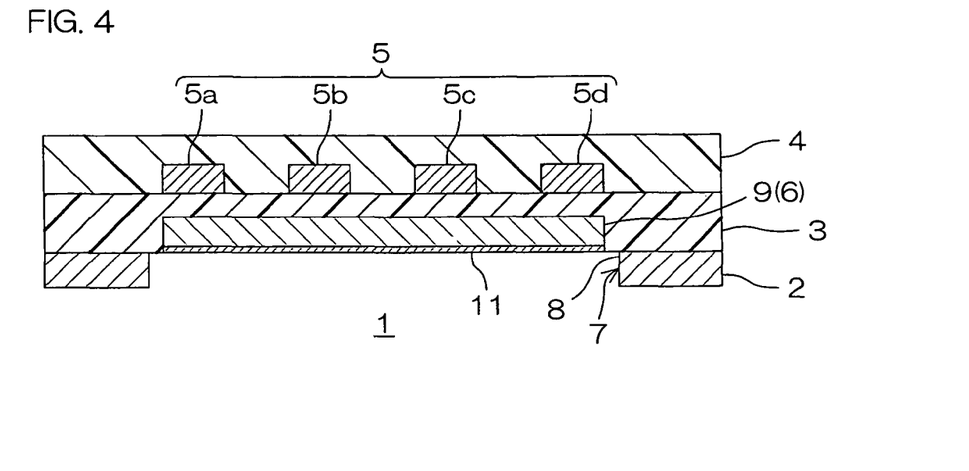
FIG. 4 is a sectional view of a principal part showing a suspension board with circuit of another embodiment of a wired circuit board of present invention.
Figure 5:
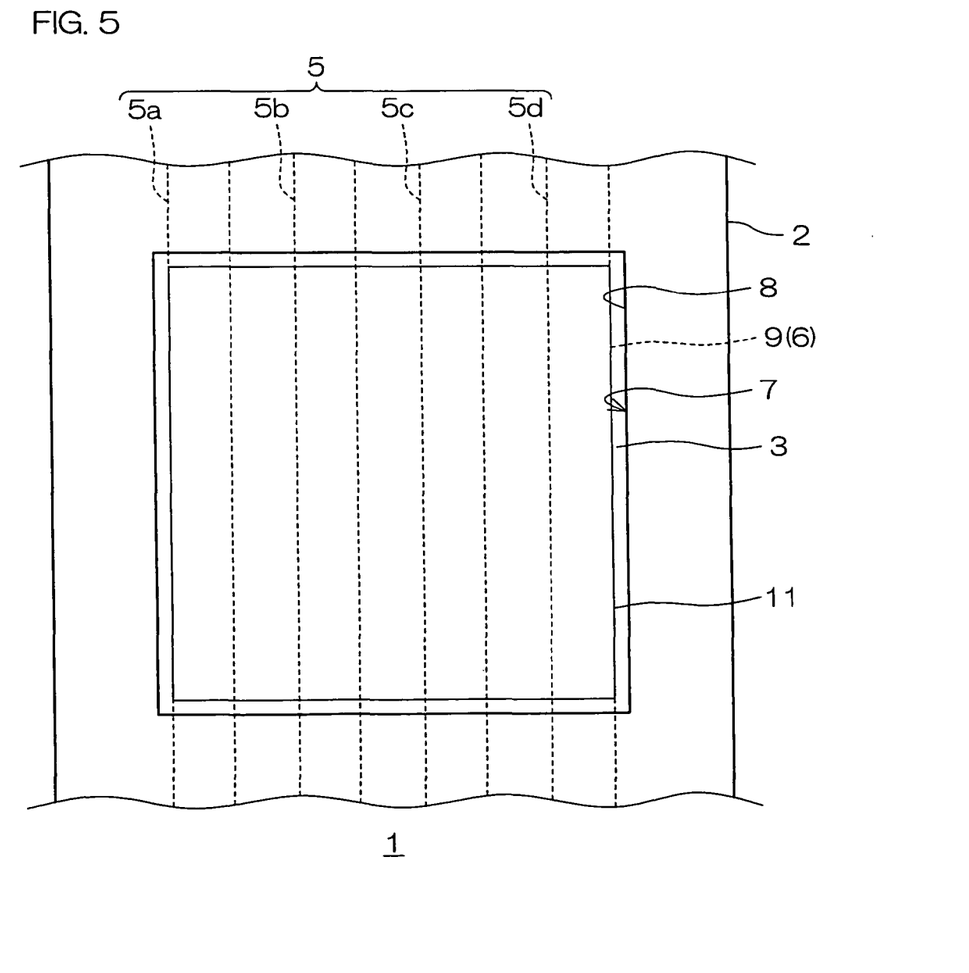
FIG. 5 is a bottom view of a principal part of the suspension board with circuit shown in FIG. 4.

Although the metal foil 6 is formed as the pattern comprising the first metal foil portion 9 and the second metal foil portion 10 in the suspension board with circuit 1, the metal foil 6 may be formed as another pattern comprising the first metal foil portion 9 only, without the second metal foil portion 10, as shown in FIGS. 4 and 5. Even when the metal foil 6 is formed of the first metal foil portion 9 only, the marginal portion 8 of the opening 7 in the metal supporting board 2 can be put in direct contact with the insulating base layer 3. Hence, the adhesion of the metal supporting board 2 at the marginal portion 8 of the opening 7 can be enhanced. This can produce the result of preventing stripping of the metal supporting board 2 effectively, while adjusting a characteristic impedance of the conductive pattern 5 and reducing a transmission loss of the same with a simple structure.

Same reference numerals in FIGS. 4 and 5 refer to the same parts in FIGS. 1 and 2, while the description thereon is omitted. Further, the thin protection film 17 described above (Cf. FIG. 3(*i*)) is omitted in FIGS. 4 and 5.

Although the opening 7 is formed in a rectangular shape as viewed from the bottom in the above illustration, no particular limitation is imposed on the form of the opening 7. For example, the opening 7 may be formed in a circular shape as viewed from the bottom.

EXAMPLES

While in the following, the present invention will be described in further detail with reference to Examples, the present invention is not limited thereto.

Example 1

A thin chromium film of 0.03 μm thick and a thin copper film of 0.071 μm thick, each serving as a thin metal film, were sequentially formed on a metal supporting board of stainless steel of 25 μm thick by sputtering (Cf. FIG. 3(*a*)). Then, a plating resist of a pattern reverse to a pattern of a metal foil was formed by using a dry film resist (Cf. FIG. 3(*b*)). Then, a copper foil of 4.0 μm thick, serving as the metal foil, was formed on the surface of the thin metal film exposed from the plating resist by electrolytic copper plating using an aqueous solution of copper sulfate (Cf. FIG. 3(*c*)). This copper foil was formed as a pattern comprising a first copper foil portion of a first metal foil portion, and a second copper foil portion of a second metal foil portion (Cf. FIG. 2). Then, after the plating resist was removed by stripping using an aqueous solution of sodium hydroxide, the thin metal film in an area where the plating resist was formed were removed by etching (Cf. FIG. 3(*d*)). Then, a thin nickel film of 0.1 μm thick, serving as a thin protection film, was formed on the surfaces of the metal foil and thin metal film (respective surfaces of the upper and lateral side surfaces of the metal foil and the lateral side surfaces of the thin metal film) (Cf. FIG. 3(*e*)) Then, after a varnish of a photosensitive polyamic acid resin was coated over the metal supporting board to cover the metal foil, the thin metal film, and the thin protection film, the coating was exposed to light and then developed and further cured by heat. As a result of this, an insulating base layer of polyimide resin of 10 μm thick was formed (Cf. FIG. 3(*f*)). Then, a conductive pattern of 10 μm thick was formed on a surface of the insulating base layer by an additive process (Cf. FIG. 3(*g*)). Further, after the varnish of the photosensitive polyamic acid resin was coated over the insulating base layer to cover the conductive pattern, the coating was exposed to light and developed and further cured by heat. As a result of this, an insulating cover layer of polyimide of 5 μm thick was formed (Cf. FIG. 3(h)). Then, an opening was formed in a rectangular shape, as viewed from bottom, in a stainless steel board by etching (Cg. FIG. 3(i), FIGS. 1 and 2). Thereafter, the metal supporting board was cut out by etching. A suspension board with circuit was obtained in the manner mentioned above.

In the suspension board with circuit obtained, a space S2 between a marginal portion of the opening and a marginal portion of the first metal foil portion had a widthwise dimension of 20 μm and a lengthwise dimension of 20 μm. A space S3 between the marginal portion of the opening and a marginal portion of the second metal foil portion had a widthwise dimension of 20 μm and a lengthwise dimension of 20 μm (Cf. FIG. 2).

When the suspension board with circuit obtained was folded at the opening, the metal supporting board of the suspension board with circuit was not stripped from the insulating base layer at the opening.

Comparative Example 1

Figure 6:
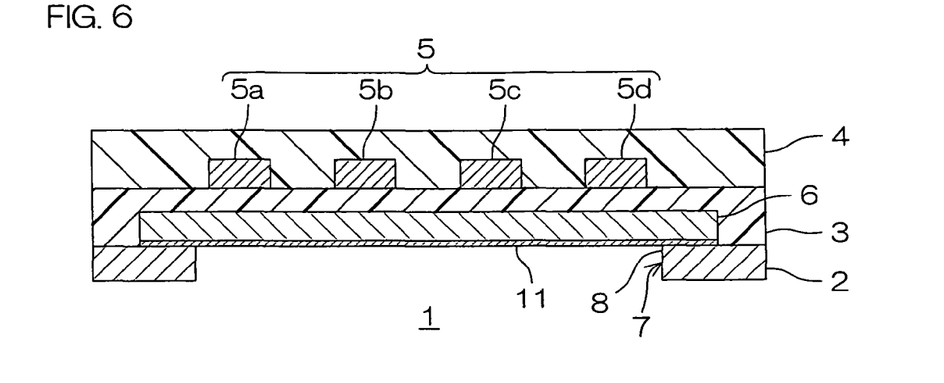
FIG. 6 is a sectional view of a principal part showing a suspension board with circuit of Comparative Example 1.
Figure 7:
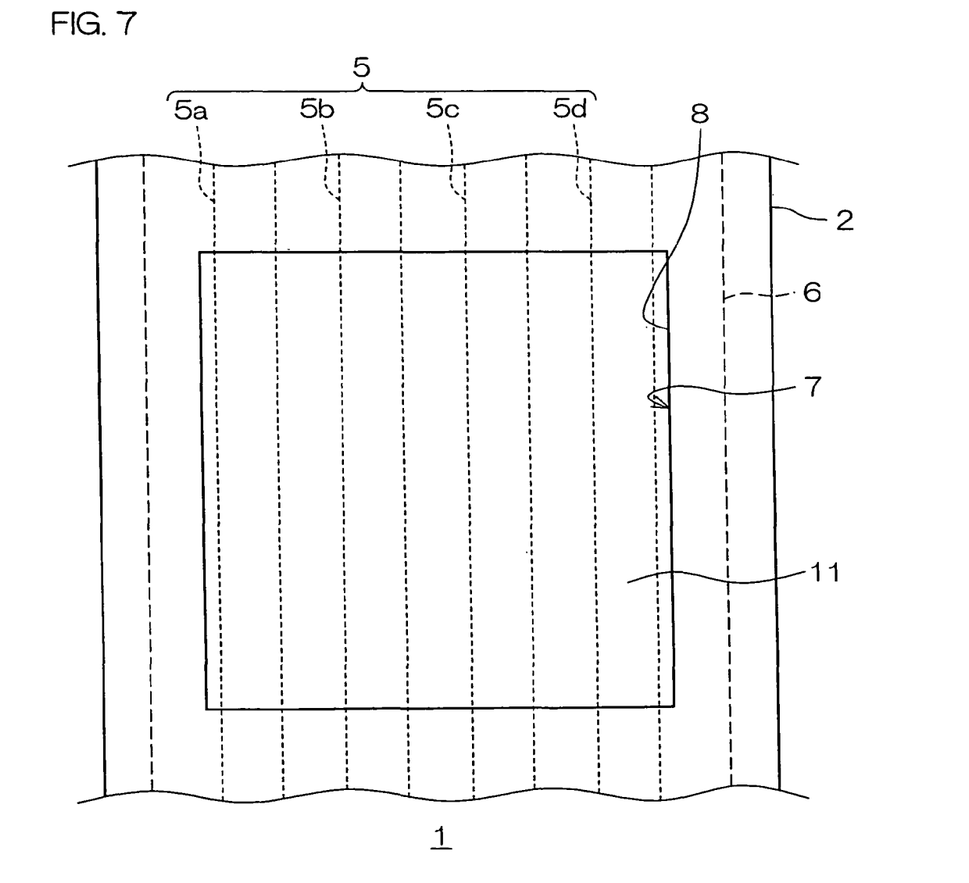
FIG. 7 is a bottom view of a principal part of the suspension board with circuit shown in FIG. 6.

Except that the metal foil was formed to extend the first metal foil portion and the second metal foil portion continuously, without forming the space S1 between the first metal foil portion and the second metal foil portion, and the opening was formed in the metal supporting board to overlap with the metal foil, without putting the marginal portion of the opening into contact with the insulating base layer, the same processes as those in Example 1 were performed to produce a suspension board with circuit (Cf. FIGS. 6 and 7).

Same reference numerals in FIGS. 6 and 7 refer to the same parts in FIGS. 1 and 2, while the description thereon is omitted. Further, the thin protection film 17 described above (Cf. FIG. 3(i)) is omitted in FIGS. 6 and 7.

When the suspension board with circuit obtained was folded at the opening, the metal supporting board of the suspension board with circuit was stripped from the insulating base layer at the opening.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
    a metal supporting board;
    an insulating layer made of resin and formed on the metal supporting board;
    a conductive pattern formed on the insulating layer; and
    a metal foil embedded in the insulating layer such that the metal foil is separated from the conductive pattern by the insulating layer and the conductive pattern is opposed to the metal foil, wherein an opening confronting at least a part of the conductive pattern is formed in and surrounded by the metal supporting board, wherein at least a part of the metal foil is placed in the opening and exposed from the insulating layer not to overlap with a marginal portion of the opening such that a gap is formed between a peripheral edge of the part of the metal foil placed in the opening and the opening in the metal supporting board, wherein the gap surrounds the part of the metal foil placed in the opening, wherein at least a part of the marginal portion of the opening of the metal supporting board is put in direct contact with the insulating layer such that an enhanced adhesion between the metal supporting board and the insulating layer is provided at the marginal portion of the opening, and wherein the opening having the part of the metal foil placed therein is operative to adjust a characteristic impedance of the conductive pattern and reduce transmission loss of the conductive pattern.

2. The wired circuit board according to claim 1, wherein the metal foil comprises:
    a first metal foil portion embedded in the insulating layer and placed in the opening, and
    a second metal foil portion embedded in the insulating layer and which is spaced apart from the first metal foil portion so that a contact portion of the marginal portion of the opening of the metal supporting board with the insulating layer is located between the first metal foil portion and the second metal foil portion to confront the metal supporting board.

3. The wired circuit board according to claim 2, wherein a thin metal film is interposed between the metal supporting board and the second metal foil portion.

4. The wired circuit board according to claim 1, wherein the metal supporting board is formed of stainless steel, wherein the metal foil is formed of copper or a copper alloy, and wherein the insulating layer is formed of polyimide.

5. The wired circuit board according to claim 1, wherein the wired circuit board comprises a suspension board with circuit.

* * * * *